United States Patent
Nada et al.

(10) Patent No.: US 11,164,986 B2
(45) Date of Patent: Nov. 2, 2021

(54) AVALANCHE PHOTODIODE AND METHOD OF MANUFACTURING THE SAME

(71) Applicant: NIPPON TELEGRAPH AND TELEPHONE CORPORATION, Tokyo (JP)

(72) Inventors: Masahiro Nada, Tokyo (JP); Hideaki Matsuzaki, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 16/643,825

(22) PCT Filed: Aug. 28, 2018

(86) PCT No.: PCT/JP2018/031674
§ 371 (c)(1),
(2) Date: Mar. 2, 2020

(87) PCT Pub. No.: WO2019/049718
PCT Pub. Date: Mar. 14, 2019

(65) Prior Publication Data
US 2021/0066528 A1 Mar. 4, 2021

(30) Foreign Application Priority Data
Sep. 6, 2017 (JP) .............................. JP2017-170988

(51) Int. Cl.
*H01L 31/107* (2006.01)
*H01L 31/18* (2006.01)

(52) U.S. Cl.
CPC ...... *H01L 31/1075* (2013.01); *H01L 31/1804* (2013.01); *H01L 31/1892* (2013.01)

(58) Field of Classification Search
None
See application file for complete search history.

(56) References Cited

U.S. PATENT DOCUMENTS

2004/0134416 A1* 7/2004 Furuyama ........... H01L 31/1844
117/84
2006/0273421 A1 12/2006 Yasuoka et al.
(Continued)

FOREIGN PATENT DOCUMENTS

CN   101490854 A   7/2009
CN   101490856 A   7/2009
(Continued)

OTHER PUBLICATIONS

Campbell, Joe C., "Recent Advances in Telecommunications Avalanche Photodiodes", Journal of Lightwave Technology, vol. 25, No. 1, Jan. 2007, pp. 109-121.
(Continued)

*Primary Examiner* — Benjamin P Sandvik
(74) *Attorney, Agent, or Firm* — Womble Bond Dickinson (US) LLP

(57) ABSTRACT

An n-type semiconductor layer (102), a multiplication layer (103), an electric field control layer (104), a light absorption layer (105), and a p-type semiconductor layer (106) are formed on a growth substrate (101), and the p-type semiconductor layer (106) is adhered on a transfer substrate (107). After that, the growth substrate (101) is removed, and the n-type semiconductor layer (102) is processed to have an area smaller than that of the multiplication layer (103).

17 Claims, 6 Drawing Sheets

(56) References Cited

U.S. PATENT DOCUMENTS

| | | | |
|---|---|---|---|
| 2008/0012104 A1 | 1/2008 | Pauchard et al. | |
| 2008/0017883 A1 | 1/2008 | Sarid et al. | |
| 2011/0241150 A1* | 10/2011 | Ishibashi | H01L 31/1075 257/438 |
| 2013/0292741 A1 | 11/2013 | Huang et al. | |
| 2014/0291682 A1 | 10/2014 | Huang et al. | |
| 2015/0028443 A1* | 1/2015 | Shi | H01L 31/1075 257/438 |
| 2016/0351743 A1 | 12/2016 | Yu et al. | |
| 2018/0331246 A1* | 11/2018 | Nada | H01L 31/03046 |

FOREIGN PATENT DOCUMENTS

| | | |
|---|---|---|
| CN | 105247691 A | 1/2016 |
| EP | 3089224 A1 | 11/2016 |
| GB | 2454121 A | 4/2009 |
| GB | 2454607 A | 5/2009 |
| JP | 61-226973 A | 10/1986 |
| WO | 2008/011281 A1 | 1/2008 |
| WO | 2008/011323 A2 | 1/2008 |
| WO | 2015/120583 A1 | 8/2015 |

OTHER PUBLICATIONS

Huang et al., "25 Gb/s Normal Incident Ge/Si Avalanche Photodiode", European Conference on Optical Communication (ECOC), We.2.4.4, Sep. 2014, pp. 1-3.

International Preliminary Report on Patentability received for PCT Patent Application No. PCT/JP2018/031674, dated Mar. 19, 2020, 10 pages (6 pages of English Translation and 4 pages of Original Document).

International Search Report and Written Opinion received for PCT Patent Application No. PCT/JP2018/031674, dated Nov. 13, 2018, 12 pages (6 pages of English Translation and 6 pages of Original Document).

Muramoto et al., "InP/InGaAs pin photodiode structure maximising bandwidth and efficiency", Electronics Letters, vol. 39, No. 24, Nov. 27, 2003, 2 pages.

Gity et al., "Modeling the Effects of Interface Traps on the Static and Dynamic Characteristics of Ge/Si Avalanche Photodiodes", IEEE Journal of Quantum Electronics, vol. 47, No. 6, Jun. 2011, pp. 849-857.

Supplementary European Search Report and Search Opinion received for EP Patent Application No. 18852882.2, dated Nov. 27, 2020, 7 pages.

* cited by examiner

AVALANCHE PHOTODIODE AND METHOD OF MANUFACTURING THE SAME

TECHNICAL FIELD

The present invention relates to an avalanche photodiode and a method of manufacturing the same.

BACKGROUND ART

A general photoreceiver in optical communication includes a light-receiving device such as a photodiode (PD) or an avalanche photodiode (APD), and a transimpedance amplifier for amplifying a photocurrent generated by the light-receiving device. The light-receiving device converts incident light to an electric current. The upper limit of the photoelectric conversion efficiency of the photodiode is 100% as a quantum efficiency.

On the other hand, the avalanche photodiode has a quantum efficiency exceeding 100% and is applied to a high-sensitivity photoreceiver, as is well known (see non-patent literature 1). In the avalanche photodiode, photoelectrons generated inside the device are collided against lattice atoms by being accelerated under a high electric field, thereby ionizing the lattice atoms and amplifying carriers. Accordingly, the avalanche photodiode outputs a plurality of carriers with respect to one photon. Consequently, the avalanche photodiode can have sensitivity exceeding 100% as a quantum conversion efficiency.

The avalanche photodiode for optical communication is mainly made of a group III-V compound semiconductor. For example, InGaAs that lattice-matches with InP is used in a light absorption layer. Also, InP or InAlAs is used in a multiplication layer. This is so because there is an assumption that InGaAs having an absorption band at the communication wavelength and having a high carrier transport rate is applied as the material of the light absorption layer.

Recently, however, a crystal growth technique that directly grows Ge on Si has been established, and "an Si-based avalanche photodiode" in which the light absorption layer is made of Ge and the multiplication layer is made of Si is attracting attention. Ge is inferior to InGaAs in the light absorption coefficient in the communication wavelength band and the electron and hole saturation rates, but a predetermined high-speed operation has been experimentally exhibited, and an operation up to 25 Gbit/s has been confirmed (non-patent literature 2).

Forming the avalanche photodiode on an Si substrate makes manufacture using a large-diameter wafer possible, which is difficult for a group III-V semiconductor-based avalanche photodiode. In addition, the avalanche photodiode can be formed on an Si substrate by using an electronic device process line that has been used for a CMOS or a bipolar transistor. These advantages give the Si-based avalanche photodiode superiority in that mass-production and a low cost are likely to be achieved.

When applying the avalanche photodiode optical communication, a reduction of the dark current is one of the most important technical matters. This is so because when the dark current of the avalanche photodiode is high, not only the reliability of a long-term operation deteriorates, but also the S/N ratio of a received signal may decrease. When the dark current of the avalanche photodiode becomes larger than circuit noise in a photoreceiver or another noise current generated by a transimpedance amplifier or the like, it is impossible to improve the reception sensitivity in accordance with the gain of the avalanche photodiode.

An example of main elements of the dark current of the avalanche photodiode is a side dark current. The cause of generation of the side dark current is related to the electric charge state on the device-side surface of the avalanche photodiode. In the vicinity of the surface of a semiconductor material such as a group III-V semiconductor or Si, the Fermi level is generally pinned to the conduction band side. Accordingly, electrons in the avalanche photodiode device move toward the device surface (side surface). In case where the degree of this electron movement to the side surface is serious, an electron channel layer is formed on the side surface of the device.

To suppress the side dark current of the avalanche photodiode described above, an electric field constricting structure using ion implantation or a selective doping technique such as selective diffusion is often used. FIG. 5A shows an avalanche photodiode having the electric field constricting structure. In this avalanche photodiode, an n-type semiconductor layer 202, an Si multiplication layer 203, a p-type Si electric field control layer 204, and a Ge light absorption layer 205 are stacked on a substrate 201. In addition, a p-type impurity region 206 is formed on the surface of the Ge light absorption layer 205. Note that FIG. 5B is a schematic band diagram near the device surface, in the direction of the plane of this avalanche photodiode.

The p-type impurity region 206 is a region formed by performing selective doping for obtaining p-type in a region having an area smaller than the avalanche photodiode device (the Ge light absorption layer 205). By thus forming the p-type impurity region 206, an electric field generated inside the device can be restricted to the p-type impurity region 206 when the avalanche photodiode is operating.

RELATED ART LITERATURE

Patent Literature

Non-Patent Literature 1: J. C. Campbel, "Recent Advances in Telecommunications Avalanche Photodiodes", Journal of Lightwave Technology, vol. 25, no. 1, pp. 109-121, 2007.

Non-Patent Literature 2: Mengyuan Huang et al., "25 Gb/s Normal Incident Ge/Si Avalanche Photodiode", European Conference on Optical Communication (ECOC), We.2.4.4, 2014.

Non-Patent Literature 3: Y. Muramoto and T. Ishibashi, "InP/InGaAs pin photodiode structure maximising bandwidth and efficiency", Electronics Letters, vol. 39, no. 24, pp. 2003.

DISCLOSURE OF INVENTION

Problem to be Solved by the Invention

Unfortunately, even when using the above-described electric field constricting structure, there is still a concern that the side dark current is generated. The electric field constricting structure suppresses the generation of an electric field by an external voltage on the side surface of the device. However, even when using the electric field constricting structure, band bending (see FIG. 5B) toward the device-side surface caused by Fermi level pinning allows electrons to easily move to the device-side surface. Thus, there is a problem that it is conventionally not easy to suppress the generation of the side dark current in an Si-based avalanche photodiode.

The present invention has been made to solve the above problem, and has as its object to make it possible to suppress the generation of the side dark current in an Si-based avalanche photodiode.

Means of Solution to the Problem

A method of manufacturing an avalanche photodiode according to the present invention is a method of manufacturing an avalanche photodiode including a p-type semiconductor layer formed on a transfer substrate and made of a p-type semiconductor, a light absorption layer formed on the p-type semiconductor layer and made of germanium, an electric field control layer formed on the light absorption layer and made of a p-type semiconductor, a multiplication layer formed on the electric field control layer and made of silicon, and an n-type semiconductor layer formed on the multiplication layer and made of n-type silicon, including a first step of forming the n-type semiconductor layer, the multiplication layer, the electric field control layer, and the light absorption layer on a growth substrate, a second step of transferring the n-type semiconductor layer, the multiplication layer, the electric field control layer, and the light absorption layer formed on the growth substrate to the transfer substrate, and a third step of processing the n-type semiconductor layer to have an area smaller than that of the multiplication layer, after the n-type semiconductor layer, the multiplication layer, the electric field control layer, and the light absorption layer are transferred to the transfer substrate.

An avalanche photodiode according to the present invention includes a p-type semiconductor layer formed on a substrate and made of a p-type semiconductor, a light absorption layer formed on the p-type semiconductor layer and made of germanium, an electric field control layer formed on the light absorption layer and made of a p-type semiconductor, a multiplication layer formed on the electric field control layer and made of silicon, and an n-type semiconductor layer formed on the multiplication layer, made of n-type silicon, and having an area smaller than that of the multiplication layer.

Effect of the Invention

In the present invention as explained above, a p-type semiconductor layer is formed on the side of a first substrate, an n-type semiconductor layer is formed in the upper portion of the device, and the area of the n-type semiconductor layer is made smaller than that of a multiplication layer. This achieves a superior effect that the generation of a side dark current can be suppressed in an Si-based avalanche photodiode.

BEST MODE FOR CARRYING OUT THE INVENTION

Embodiments of the present invention will be explained below with reference to the accompanying drawings.

First Embodiment

First, an avalanche photodiode manufacturing method according to the first embodiment of the present invention will be explained with reference to FIGS. 1A to 1H.

Figure 1A:
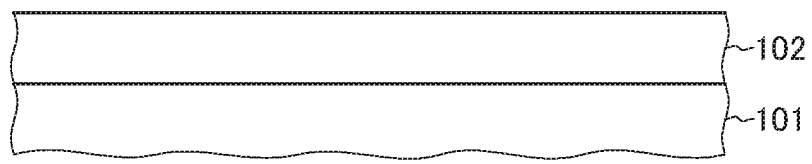
FIG. 1A is a sectional view showing the state of an intermediate step for explaining an avalanche photodiode manufacturing method according to the first embodiment of the present invention.
Figure 1B:
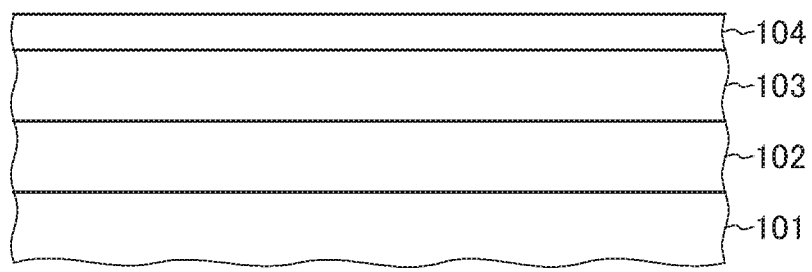
FIG. 1B is a sectional view showing the state of an intermediate step for explaining the avalanche photodiode manufacturing method according to the first embodiment of the present invention.

First, as shown in FIG. 1A, an n-type semiconductor layer 102 made of n-type silicon (Si) is formed on a growth substrate 101. The growth substrate 101 is made of, e.g., single-crystal Si. Note that the growth substrate 101 is preferably made of n-type silicon as will be described later. Then, as shown in FIG. 1B, a multiplication layer 103 made of Si is formed on the n-type semiconductor layer 102. Subsequently, an electric field control layer 104 made of a p-type semiconductor (e.g., Si) is formed on the multiplication layer 103.

The n-type semiconductor layer 102, the multiplication layer 103, and the electric field control layer 104 can be formed by, e.g., growing Si on the growth substrate 101 by well-known CVD (Chemical Vapor Deposition) or the like. Also, arsenic (As) or the like can be used as an n-type dopant. In addition, boron (B) or the like can be used as a p-type dopant.

Figure 1C:
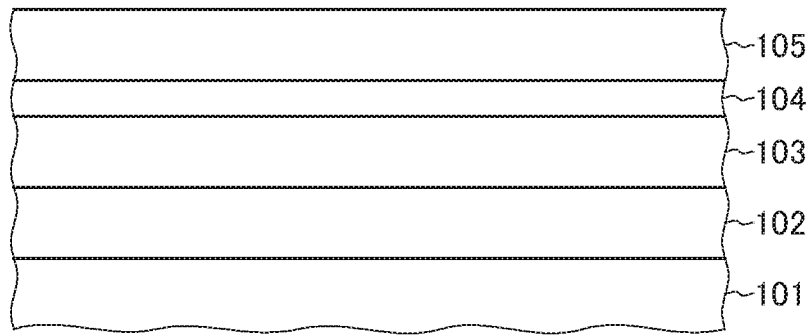
FIG. 1C is a sectional view showing the state of an intermediate step for explaining the avalanche photodiode manufacturing method according to the first embodiment of the present invention.
Figure 1D:
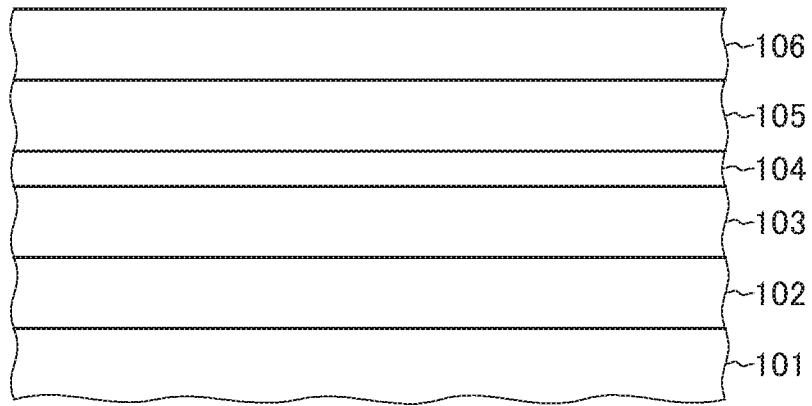
FIG. 1D is a sectional view showing the state of an intermediate step for explaining the avalanche photodiode manufacturing method according to the first embodiment of the present invention.

Then, as shown in FIG. 1C, a light absorption layer 105 made of germanium (Ge) is formed on the electric field control layer 104. As shown in FIG. 1D, a p-type semiconductor layer 106 made of a p-type semiconductor is formed on the light absorption layer 105 (a first step). The p-type semiconductor layer 106 can be made of Ge or the like. For example, the light absorption layer 105 and the p-type semiconductor layer 106 can be formed by depositing germanium at a growth temperature of 600° C. by thermal CVD using $GeH_4$ as a source gas. Since this growth temperature condition is sufficiently lower than that of Si, no damage is exerted on the n-type semiconductor layer 102, the multiplication layer 103, and the electric field control layer 104 as lower layers made of Si.

Figure 1E:
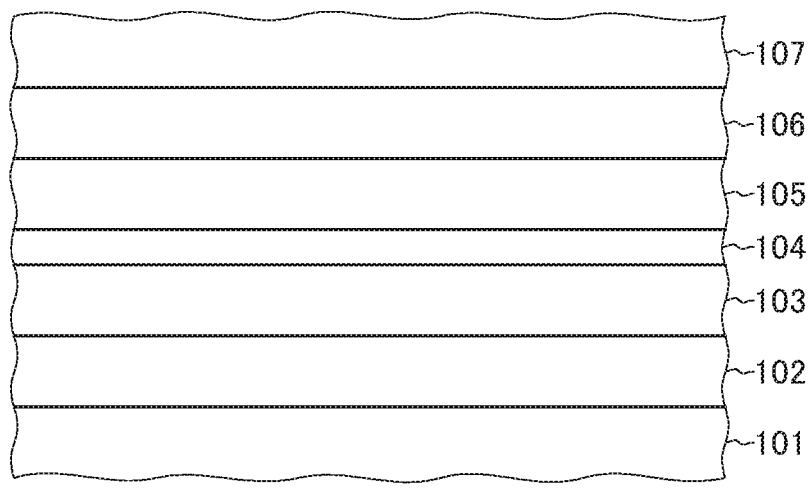
FIG. 1E is a sectional view showing the state of an intermediate step for explaining the avalanche photodiode manufacturing method according to the first embodiment of the present invention.

Subsequently, as shown in FIG. 1E, the p-type semiconductor layer 106 is adhered on a transfer substrate 107. From the viewpoint of, e.g., a reduction of the parasitic capacitance of the device, the transfer substrate 107 is preferably made of a high-resistance material. For example, the transfer substrate 107 can be made of high-resistance Si or SiC. When the transfer substrate 107 is made of SiC having a higher thermal conductivity, the heat dissipation of the device can be improved.

The p-type semiconductor layer 106 can be adhered on the transfer substrate 107 by using a bonding method such as a surface activation method or an atomic diffusion method. For example, the bonding surfaces can be adhered by activating each bonding surface by irradiating it with an Ar beam. The above-mentioned adhesion can also be performed by metal bonding using a metal layer having a thickness of a few hundred nm.

Figure 1F:
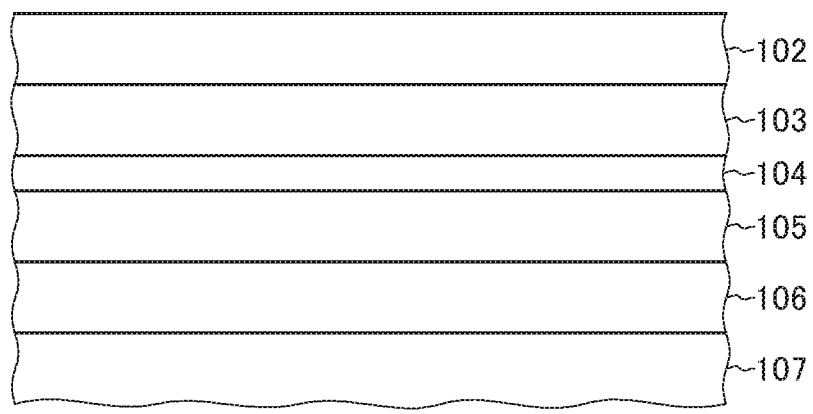
FIG. 1F is a sectional view showing the state of an intermediate step for explaining the avalanche photodiode manufacturing method according to the first embodiment of the present invention.

The growth substrate 101 is removed after the p-type semiconductor layer 106 is adhered on the transfer substrate 107 as described above. FIG. 1F shows the state after this removal. The growth substrate 101 can be removed by, e.g., a well-known etching technique. When the growth substrate 101 is made of n-type Si, there is no influence on the electrical characteristics even if the growth substrate 101 slightly remains after the removal. In this case, the process can also be simplified because it is unnecessary to form any etching stop layer.

In the present invention as described above, after the n-type semiconductor layer 102, the multiplication layer 103, the electric field control layer 104, and the light absorption layer 105 are formed on the growth substrate, these layers are transferred to the transfer substrate 107 by adhesion (a second step). In the first embodiment, the n-type semiconductor layer 102, the multiplication layer 103, the electric field control layer 104, the light absorption layer 105, and the p-type semiconductor layer 106 are formed on the growth substrate 101, and these layers are transferred to the transfer substrate 107 after that.

In the first step of the first embodiment, the n-type semiconductor layer 102, the multiplication layer 103, the electric field control layer 104, the light absorption layer 105, and the p-type semiconductor layer 106 are formed in this order on the growth substrate 101. Also, the second step includes a step of transferring the n-type semiconductor layer 102, the multiplication layer 103, the electric field control layer 104, and the light absorption layer 105 formed on the growth substrate 101 to the transfer substrate 107, and a step of adhering the p-type semiconductor layer 106 on the transfer substrate 107 and removing the growth substrate 101 after that.

Figure 1G:
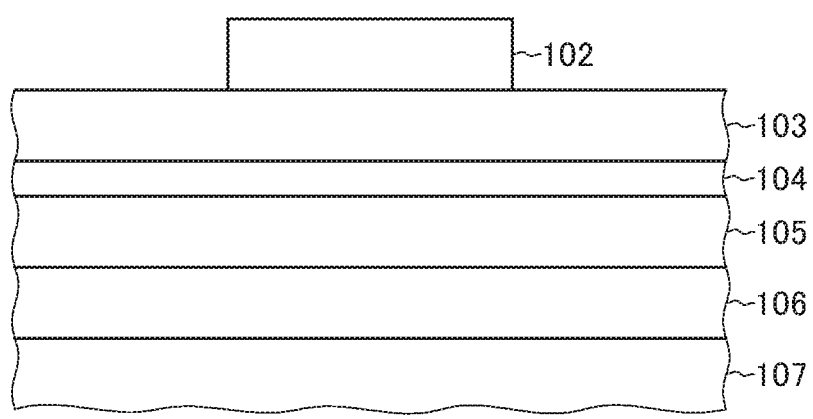
FIG. 1G is a sectional view showing the state of an intermediate step for explaining the avalanche photodiode manufacturing method according to the first embodiment of the present invention.
Figure 1H:
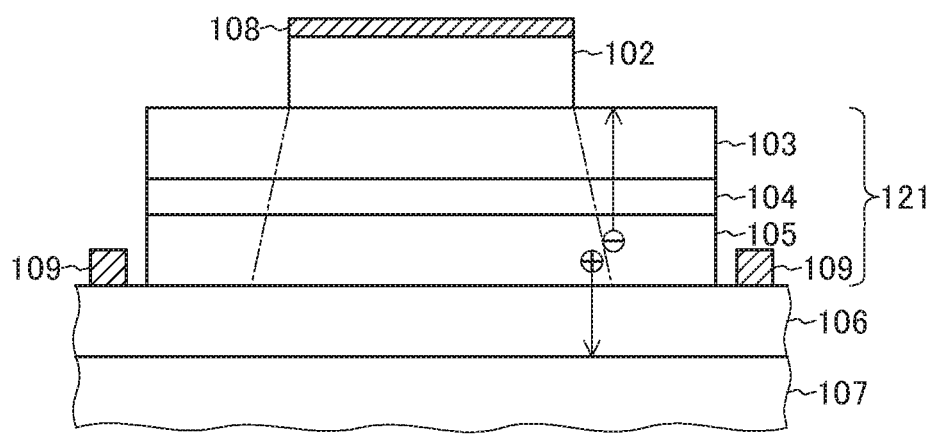
FIG. 1H is a sectional view showing the state of an intermediate step for explaining the avalanche photodiode manufacturing method according to the first embodiment of the present invention.

As shown in FIG. 1G, after the layers are transferred to the transfer substrate 107 and the growth substrate 101 is removed as described above, the n-type semiconductor layer 102 is processed to have an area smaller than that of the multiplication layer 103 (a third step). In addition, as shown in FIG. 1H, the light absorption layer 105, the electric field control layer 104, and the multiplication layer 103 are processed into a mesa 121 having a predetermined shape. For example, the above-described processing can be performed by patterning by a well-known photolithography, dry etching, or wet etching technique.

For example, the n-type semiconductor layer 102 is processed into the shape of the mesa 121 having a circular shape in a plan view by generally used reactive ion etching (RIE) by using a mask pattern formed by the photolithography technique. The mesa 121 may also be formed into a rectangular shape in a plan view. Then, a mask pattern having an area larger than that of the processed n-type semiconductor layer 102 is newly formed, and this new mask pattern is used to process the light absorption layer 105, the electric field control layer 104, and the multiplication layer 103 by RIE using a gas mixture of, e.g., $CF_4$ and $O_2$, thereby forming the mesa 121 having a circular shape in a plan view. The mesa 121 may also be formed into a rectangular shape in a plan view.

Furthermore, as shown in FIG. 1H, after the above-described device structure is formed, a first electrode 108 is formed on the n-type semiconductor layer 102. In addition, a second electrode 109 is formed on the p-type semiconductor layer 106 around the mesa 121 including the multiplication layer 103. The first electrode 108 and the second electrode 109 can be formed by, e.g., depositing titanium (Ti)/aluminum (Al) by using electron beam evaporation. After that, a protective layer for protecting the device is formed, and an interconnecting structure that connects to each electrode through the protective layer is formed. The protective layer can be made of, e.g., $SiO_2$ or SiN. The interconnecting structure can be made of a metal such as Au.

The avalanche photodiode of the first embodiment obtained as described above has the following structure. First, the avalanche photodiode includes the p-type semiconductor layer 106 formed on the transfer substrate 107 and made of a p-type semiconductor. Also, the avalanche photodiode includes the light absorption layer 105 formed on the p-type semiconductor layer 106 and made of germanium. The avalanche photodiode further includes the electric field control layer 104 formed on the light absorption layer 105 and made of a p-type semiconductor. In addition, the avalanche photodiode includes the multiplication layer 103 formed on the electric field control layer 104 and made of Si. The avalanche photodiode also includes the n-type semiconductor layer 102 formed on the multiplication layer 103 and made of n-type Si. The area of the n-type semiconductor layer 102 is made smaller than that of the multiplication layer 103. Note that the electric field control layer 104 is made of p-type Si in the first embodiment.

Figure 5A:
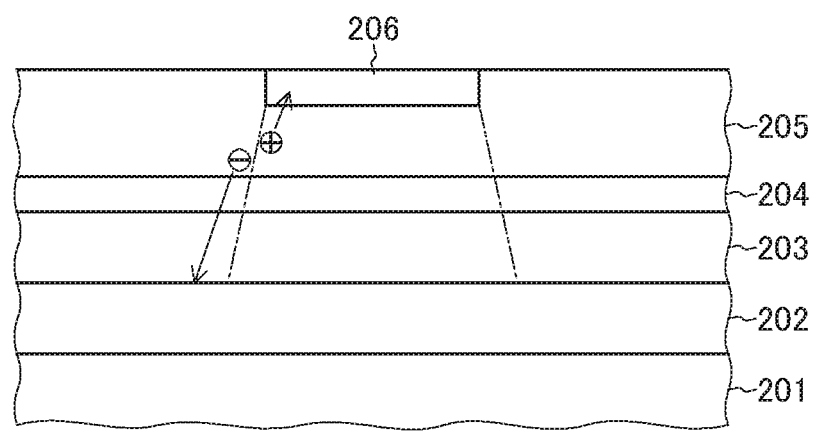
FIG. 5A is a sectional view showing the arrangement of a conventional avalanche photodiode.
Figure 5B:
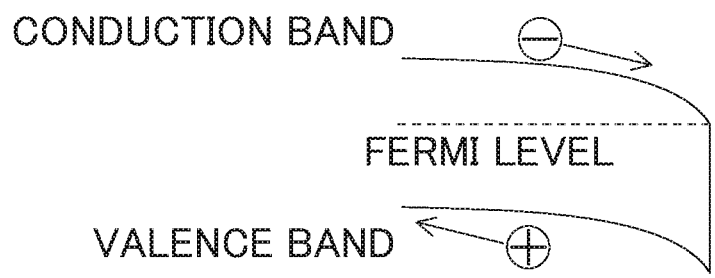
FIG. 5B is a band diagram showing an outline of the state of a band near the device surface in the direction of the plane of the conventional avalanche photodiode.

In the avalanche photodiode according to the first embodiment described above, the p-type semiconductor layer 106, the light absorption layer 105 made of Ge, the p-type electric field control layer 104, the multiplication layer 103, and the n-type semiconductor layer 102 are stacked in this order on the transfer substrate 107. In this structure, the p-type and the n-type are inverted when viewed from the substrate side, with respect to the avalanche photodiode of the related art explained with reference to FIG. 5A. Also, the area of the n-type semiconductor layer 102 is made smaller than that of the multiplication layer 103 in the first embodiment. Accordingly, the first embodiment can suppress the generation of the side dark current as compared to the related art explained with reference to FIG. 5A.

The avalanche photodiode is operated by increasing a voltage to be applied between the first electrode 108 and the second voltage 109 from 0 V to a reverse voltage. In this voltage application, the field intensity of the multiplication layer 103 rises while the electric field control layer 104 is depleted. When the application voltage becomes higher than the full depletion voltage of the electric field control layer 104, the light absorption layer 105 starts generating an electric field, and photocarriers generated in the light absorption layer 105 start drift movement. In this drift, electrons generated in the light absorption layer 105 move toward the n-type semiconductor layer 102, and holes generated in the light absorption layer 105 move toward the p-type semiconductor layer 106.

In the first embodiment, the area of the n-type semiconductor layer 102 is made smaller than that of the multiplication layer 103 (the electric field control layer 104, the light absorption layer 105, and the p-type semiconductor layer 106). When the multiplication layer 103 is depleted in the operation voltage region of the avalanche photodiode, the field density in the device is defined by the shape (formation region) of the n-type semiconductor layer 102.

As described earlier, band bending toward the device-side surface caused by surface pinning of the Fermi level biased to the conduction band allows some of electrons generated by light absorption to move to the surface on the side surface side of the device. However, when the n-type semiconductor layer 102 defines an internal electric field as in the first embodiment, a larger internal electric field allows electrons to move toward the n-type semiconductor layer 102. Consequently, the first embodiment can suppress the side dark current.

Furthermore, in the first embodiment, Si layer is not formed in a state in which a Ge layer is already been formed. In the first embodiment, an Si layer is formed first, and a Ge layer is formed after the Si layer is formed. The growth temperatures of Ge and Si are significantly different, i.e., the growth temperature of Si is higher. If a Si layer is formed in a state in which a Ge layer is already been formed, the Ge layer is damaged by heat when the Si layer is grown. On the other hand, in the first embodiment, an Si layer having a higher growth temperature is grown first, and a Ge layer having a lower growth temperature is grown after that. This makes it possible to form both layers while suppressing thermal damages.

Second Embodiment

Figure 2:
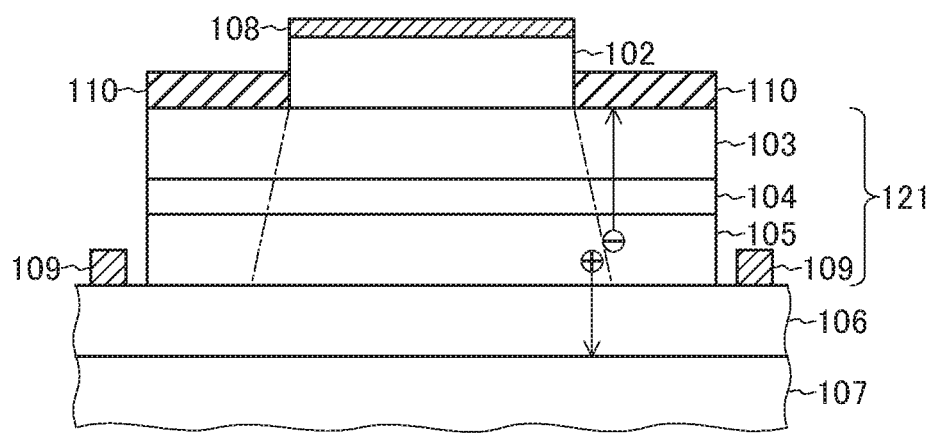
FIG. 2 is a sectional view showing the arrangement of an avalanche photodiode according to the second embodiment of the present invention.

Next, the second embodiment of the present invention will be explained with reference to FIG. 2. In the second embodiment as shown in FIG. 2, an insulating layer 110 is further formed on a multiplication layer 103 around an n-type semiconductor layer 102 (a fourth step), in the avalanche photodiode manufacturing method of the first embodiment described above. For example, after the second step, a mask pattern covering the region of the n-type semiconductor layer 102 is formed, and $SiO_2$ or the like is deposited in this state by sputtering in a state in which the perpendicular anisotropy is high. After that, the $SiO_2$ insulating layer 110 can be formed on the semiconductor layer 103 around the n-type semiconductor layer 102 by removing (lifting off) the mask pattern.

Since the second embodiment includes the insulating layer 110, it is possible to suppress the formation of an electron channel to the device-side surface when thermal excitation occurs at the operation temperature.

As described previously, the avalanche photodiode is operated by increasing a voltage to be applied between a first electrode 108 and a second electrode 109 from 0 V to a reverse voltage. When photocarriers generated in a light absorption layer 105 start drift movement in the operation state, electrons generated in the light absorption layer 105 move toward the n-type semiconductor layer 102, and holes generated in the light absorption layer 105 move toward a p-type semiconductor layer 106.

The area of the n-type semiconductor layer 102 is smaller than that of the multiplication layer 103 (an electric field control layer 104, the light absorption layer 105, and the p-type semiconductor layer 106) in the second embodiment as well. In the second embodiment, therefore, electrons move toward the n-type semiconductor layer 102, so the side dark current can be suppressed, as in the above-described first embodiment. However, the arrangement of the first embodiment cannot suppress the formation of an electron channel to the device-side surface when thermal excitation occurs at the operation temperature.

On the other hand, in the second embodiment, the insulating layer 110 made of a dielectric (e.g., $SiO_2$) is formed in a portion (terrace) above the multiplication layer 103 around the n-type semiconductor layer 102. For example, it is known that $SiO_2$ forms only an interface state much smaller than that of Si, so the Fermi level of Si is almost pinned to the mid gap in the interface with $SiO_2$. As a consequence, carrier accumulation hardly occurs in the interface between $SiO_2$ and Si. Accordingly, electrically isolating this portion from other portions not only suppresses electrons generated on the side surfaces of the light absorption layer 105 from flowing to the n-type semiconductor layer 102, but also prevents the electrical characteristics of the interface from easily deteriorating even in a long-term operation. That is, the arrangement of the second embodiment not only suppresses the dark current but also contributes to the long-term reliability of the device operation.

Third Embodiment

Figure 3A:
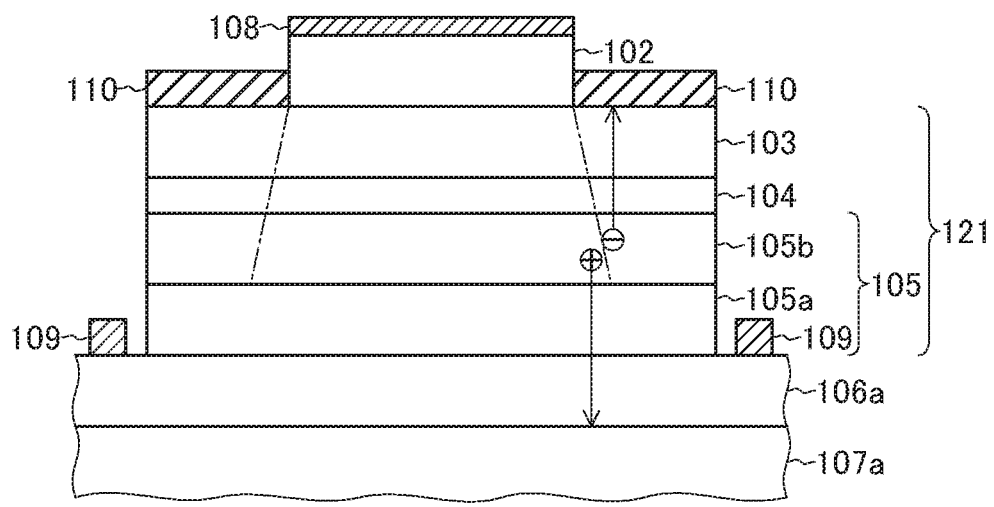
FIG. 3A is a sectional view showing the arrangement of an avalanche photodiode according to the third embodiment of the present invention.

The third embodiment of the present invention will be explained below with reference to FIGS. 3A and 3B. In the third embodiment, a p-type region is formed on that side of a light absorption layer 105, which faces a p-type semiconductor layer 106a in the thickness direction, in the avalanche photodiode of the second embodiment described above. Thus, the third embodiment further includes a step of forming the p-type region on that side of the light absorption layer 105, which faces the p-type semiconductor layer 106a. In the third embodiment as shown in FIG. 3A, the light absorption layer 105 includes a p-type light absorption layer 105a in the region on the side of the p-type semiconductor layer 106a, and an undoped light absorption layer 105b. The light absorption layer 105 has a multilayered structure including the p-type light absorption layer 105a and the light absorption layer 105b.

Also, in the third embodiment, a transfer substrate 107a is made of GaAs, and the p-type semiconductor layer 106a is made of p-type GaAs. In this case, an n-type semiconductor layer 102, a multiplication layer 103, an electric field control layer 104, and the light absorption layer 105 are first formed on a growth substrate (not shown). Note that after the light absorption layer 105 is formed by depositing Ge on the electric field control layer 104, the p-type light absorption layer 105a is formed by doping a p-type impurity to a predetermined depth from the surface side. On the other hand, the p-type semiconductor layer 106a is formed on the transfer substrate 107a. After that, the p-type semiconductor layer 106a is adhered on the light absorption layer 105 (the p-type light absorption layer 105a), and the growth substrate is removed.

In the third embodiment, a first step includes a step of forming the n-type semiconductor layer 102, the multiplication layer 103, the electric field control layer 104, and the light absorption layer 105 in this order on the growth substrate, and a step of forming the p-type semiconductor layer 106a on the transfer substrate 107a. Also, a second step includes a step of transferring the n-type semiconductor layer 102, the multiplication layer 103, the electric field control layer 104, and the light absorption layer 105 formed on the growth substrate to the transfer substrate 107a, by adhering the p-type semiconductor layer 106a on the light absorption layer 105 (the p-type light absorption layer 105a), and a step of removing the growth substrate after the p-type semiconductor layer 106a is adhered on the light absorption layer 105 (the p-type light absorption layer 105a).

After the p-type semiconductor layer 106a, the light absorption layer 105, the electric field control layer 104, the multiplication layer 103, and the n-type semiconductor layer 102 are stacked on the transfer substrate 107a as described above, the n-type semiconductor layer 102 is processed to have an area smaller than that of the multiplication layer 103. Also, the light absorption layer 105, the electric field control layer 104, and the multiplication layer 103 are processed into a mesa 121 having a predetermined shape. After the device structure is formed as described above, a first electrode 108 is first formed on the n-type semiconductor layer 102 as shown in FIG. 3A. Then, a second electrode 109 is formed on the p-type semiconductor layer 106a around the mesa 121 including the multiplication layer 103. In addition, an insulating layer 110 is formed on the multiplication layer 103 around the n-type semiconductor layer 102.

In the third embodiment having the above-described arrangement, when the avalanche photodiode is operated by increasing a voltage to be applied between the first electrode 108 and the second embodiment 109 from 0 V to a reverse voltage, the field intensity of the multiplication layer 103 rises while the electric field control layer 104 is depleted. When the application voltage becomes higher than the full depletion voltage of the electric field control layer 104, the undoped light absorption layer 105b starts generating an electric field, and photocarriers generated in the light absorption layer 105b starts drift movement. Also, of photocarriers generated in the p-type light absorption layer 105a, electrons move by diffusion, and holes move to the p-type semiconductor layer 106a with a dielectric relaxation time.

In an Si/Ge-based avalanche photodiode, the degree of freedom of the layer configuration is not necessarily high. For example, in a group III-V semiconductor, a structure called a MIC (Maximum Induced Current) structure that achieves both high speed and high sensitivity in a light absorption layer is known (non-patent literature 3). This is a structure obtained by combining an anti-diffusion layer made of a material having a relatively wide gap, a p-type light absorption layer, and an undoped light absorption layer in this order when viewed from the p-type semiconductor layer. Of photocarriers in the p-type light absorption layer, only electrons are basically effective carriers, and a diffusion mechanism moves the electrons by charge transport. The anti-diffusion layer made of the widegap material prevents the electrons from flowing backward in the direction of the p-type semiconductor layer.

When forming an Si/Ge-based light absorption layer, however, it is known that the energy position of the conduction band almost remains unchanged regardless of whether the material form is Si, Ge, or Si/Ge mixed crystal. This means that no anti-diffusion layer can be formed even when forming the abovementioned MIC light absorption layer structure by using the Si/Ge-based material. When there is no anti-diffusion layer, electrons generated in the p-type light absorption layer move by diffusion to the p-type semiconductor layer as well and hence cannot be extracted as effective carriers, and as a consequence the sensitivity decreases.

On the other hand, in the third embodiment, the p-type semiconductor layer 106a is made of a relatively widegap group III-V compound semiconductor. This implements the light absorption layer 105 having the MIC structure even in an SiGe-based avalanche photodiode, and makes high speed and high sensitivity possible.

Figure 3B:
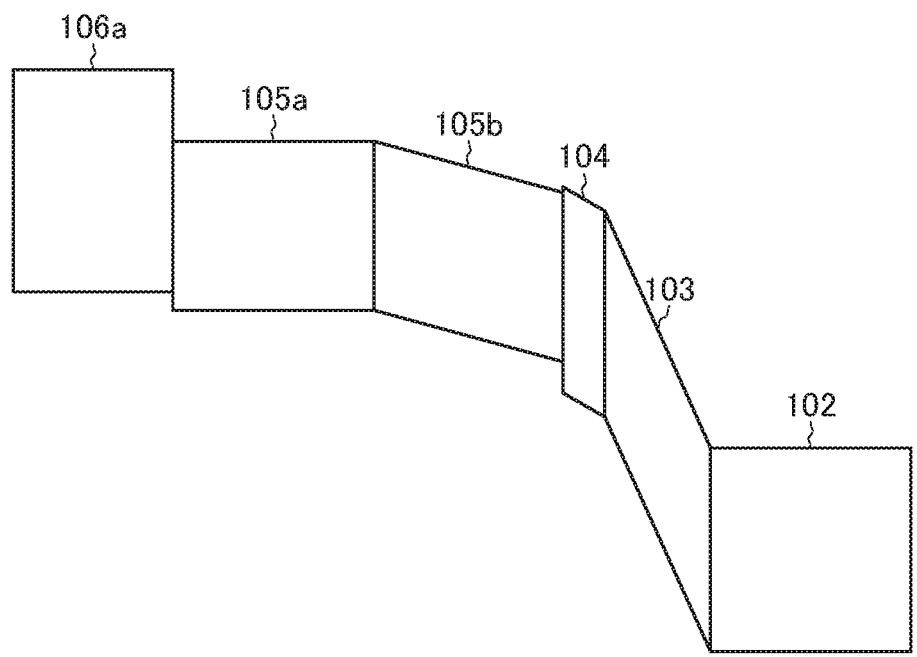
FIG. 3B is a view for explaining the band structure of the avalanche photodiode according to the third embodiment.

FIG. 3B shows the band structure of the avalanche photodiode according to the third embodiment. In the third embodiment, the p-type semiconductor layer 106a also functions as an anti-diffusion layer. When compared to Ge, the end of the conduction band of GaAs is positioned closer to the high energy side. Therefore, electrons generated in the p-type light absorption layer 105a do not diffuse to the p-type semiconductor layer 106a, but selectively move by diffusion in the direction of the multiplication layer 103.

Furthermore, GaAs can be doped heavier than Si. Accordingly, the device resistance of the avalanche photodiode of the third embodiment can be reduced compared to that of a general Si-based avalanche photodiode. Thus, the third embodiment can reduce the dark current of an avalanche photodiode, can ensure the long-term reliability of a device operation, and can further obtain high speed and high sensitivity.

Fourth Embodiment

Figure 4:
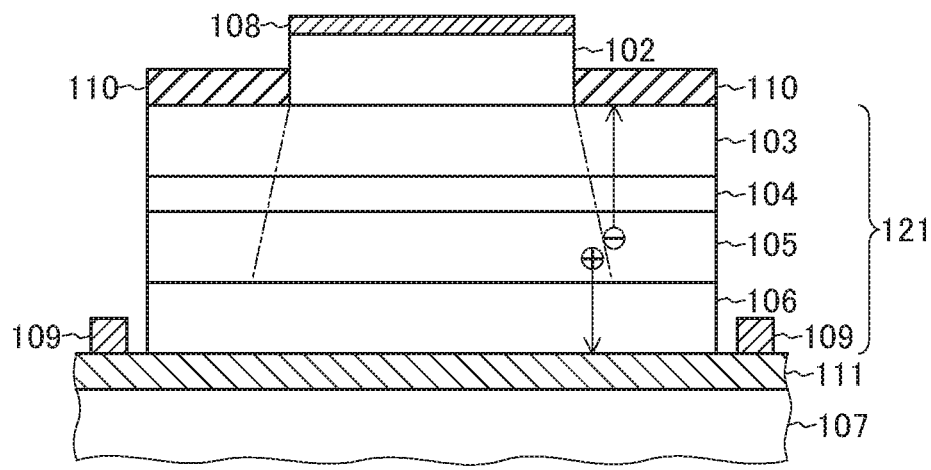
FIG. 4 is a sectional view showing the arrangement of an avalanche photodiode according to the fourth embodiment of the present invention.

The fourth embodiment of the present invention will be explained below with reference to FIG. 4. In the fourth embodiment, a metal layer 111 is formed on a transfer substrate 107, and a p-type semiconductor layer 106 is formed on the metal layer 111, in the first embodiment described previously. First, as in the above-described first embodiment, an n-type semiconductor layer 102, a multiplication layer 103, an electric field control layer 104, a light absorption layer 105, and the p-type semiconductor layer 106 are formed on a growth substrate (not shown). On the other hand, the metal layer 111 including a 20-nm thick Ti layer and a 400-nm thick Au layer is formed on a transfer substrate 107. For example, a predetermined metal can be deposited by sputtering, vacuum vapor deposition, or the like.

Then, the n-type semiconductor layer 102, the multiplication layer 103, the electric field control layer 104, the light absorption layer 105, and the p-type semiconductor layer 106 formed on the growth substrate are transferred to the transfer substrate 107 on which the metal layer 111 is formed. For example, the p-type semiconductor layer 106 is adhered on the metal layer 111, and the growth substrate is removed after that.

After the p-type semiconductor layer 106, the light absorption layer 105, the electric field control layer 104, the multiplication layer 103, and the n-type semiconductor layer 102 are stacked on the metal layer 111 on the transfer substrate 107 as described above, the n-type semiconductor layer 102 is processed to have an area smaller than that of the multiplication layer 103. Also, in the fourth embodiment, the p-type semiconductor layer 106, the light absorption layer 105, the electric field control layer 104, and the multiplication layer 103 are processed into a mesa 121 having a predetermined shape. After the device structure is formed as described above, as shown in FIG. 4, a first electrode 108 is formed on the n-type semiconductor layer 102, and a second electrode 109 is formed on the metal layer 111 around the mesa 121 including the multiplication layer 103. In addition, an insulating layer 110 is formed on the multiplication layer 103 around the n-type semiconductor layer 102.

In the fourth embodiment, a second step includes a step of forming the metal layer 111 on the transfer substrate 107, and a step of transferring the n-type semiconductor layer 102, the multiplication layer 103, the electric field control layer 104, and the light absorption layer 105 formed on the growth substrate to the transfer substrate 107 on which the metal layer 111 is formed. The avalanche photodiode of the fourth embodiment further includes the metal layer 111 formed between the transfer substrate 107 and the p-type semiconductor layer 106.

In the fourth embodiment having the above-described structure, when the avalanche photodiode is operated by increasing a voltage to be applied between the first electrode 108 and the second electrode 109 from 0 V to a reverse voltage, the field intensity of the multiplication layer 103 rises while the electric field control layer 104 is depleted. When the application voltage becomes higher than the full depletion voltage of the electric field control layer 104, the light absorption layer 105 starts generating an electric field, and photocarriers generated in the light absorption layer 105 start drift movement.

Electrons generated in the avalanche photodiode as described above are extracted from the first electrode 108 via the n-type semiconductor layer 102, and holes are extracted from the second electrode 109 via the p-type semiconductor layer 106.

In a semiconductor material such as Si or Ge, the sheet resistance of p-type is generally higher than that of n-type. This is so because p-type heavy doping is difficult, and the mobility of holes is lower than that of electrons. In the first to the third embodiments, holes move in a direction perpendicular to the layer thickness direction of the p-type semiconductor layer 106 (a direction parallel to the plane of the transfer substrate 107), and reach the first electrode 108. In this case, the resistance of holes in the p-type semiconductor layer 106 increases, and this may increase the device resistance.

On the other hand, in the fourth embodiment, the hole current moves in the layer thickness direction in the p-type semiconductor layer 106, and is extracted from the second electrode 109 via the metal layer 111 having a low resistance. Accordingly, the fourth embodiment can essentially reduce the resistance of the p-type semiconductor layer 106, thereby broadening the CR band of the avalanche photodiode.

Also, the metal layer 111 can be used as a reflection mirror by properly setting the material of the metal layer 111. This makes it unnecessary to separately form a reflection mirror in the manufacturing processes, and incorporate a reflection mirror without increasing the manufacturing processes. Furthermore, when a lens structure is formed on the transfer substrate 107 beforehand, lenses can be integrated in the avalanche photodiode. When manufacturing a photoreceiver, therefore, it is possible to reduce the number of parts by omitting lenses, and implement a photoreceiver more easily.

In the present invention as has been explained above, a p-type semiconductor layer is arranged on a transfer substrate, an n-type semiconductor layer is arranged in the upper portion of a device, and the area of this n-type semiconductor layer is made smaller than that of a multiplication layer. Consequently, the present invention can suppress the generation of the side dark current in an Si-based avalanche photodiode. In addition, the present invention can assure the long-term reliability of the device operation, broaden the CR band by reducing the device resistance, and increase the speed of the avalanche photodiode.

Note that the present invention is not limited to the embodiments explained above, and it is obvious that those skilled in the art can make many modifications and combinations without departing from the spirit and scope of the invention. For example, it is of course also possible to form the multiplication layer, the light absorption layer, and the electric field control layer by using mixed crystal of Si and Ge.

In addition, a well-known SOI (Silicon On Insulator) substrate can be used as the transfer substrate in order to form, e.g., an optical waveguide. The transfer substrate may also be formed from diamond in order to increase the heat dissipation efficiency to the utmost limit. This makes it possible to suppress the temperature rise in the avalanche photodiode, and improve the device performance. Also, when forming the transfer substrate from SiC, it is of course possible to achieve both a predetermined improvement in heat dissipation and a low cost. Furthermore, as the bonding method to be used in transfer to the transfer substrate, it is possible to apply various bonding methods such as fusion bonding, surface activation, atomic diffusion, and metal bonding, and the present invention does not lose its generality due to these bonding methods.

EXPLANATION OF THE REFERENCE NUMERALS AND SIGNS

101 . . . growth substrate, 102 . . . n-type semiconductor layer, 103 . . . multiplication layer, 104 . . . electric field control layer, 105 . . . light absorption layer, 106 . . . p-type semiconductor layer, 107 . . . transfer substrate, 108 . . . first electrode, 109 . . . second electrode, 121 . . . mesa

The invention claimed is:

1. A method of manufacturing an avalanche photodiode including:
   a p-type semiconductor layer formed on a transfer substrate and made of a p-type semiconductor;
   a light absorption layer formed on the p-type semiconductor layer and made of germanium;
   an electric field control layer formed on the light absorption layer and made of a p-type semiconductor;
   a multiplication layer formed on the electric field control layer and made of silicon; and
   an n-type semiconductor layer formed on the multiplication layer and made of n-type silicon,
   the method comprising:
   a first step of forming the n-type semiconductor layer, the multiplication layer, the electric field control layer, and the light absorption layer on a growth substrate;
   a second step of transferring the n-type semiconductor layer, the multiplication layer, the electric field control layer, and the light absorption layer formed on the growth substrate to the transfer substrate; and a third step of processing the n-type semiconductor layer to have an area smaller than that of the multiplication layer, after the n-type semiconductor layer, the multiplication layer, the electric field control layer, and the light absorption layer are transferred to the transfer substrate.

2. The method of manufacturing an avalanche photodiode according to claim 1, wherein the first step including forming the n-type semiconductor layer, the multiplication layer, the electric field control layer, the light absorption layer, and the p-type semiconductor layer in this order on the growth substrate, and the second step includes:

a step of transferring the n-type semiconductor layer, the multiplication layer, the electric field control layer, and the light absorption layer formed on the growth substrate to the transfer substrate by adhering the p-type semiconductor layer on the transfer substrate; and a step of removing the growth substrate after the p-type semiconductor layer is adhered on the transfer substrate.

3. The method of manufacturing an avalanche photodiode according to claim 2, further comprising a fourth step of processing the n-type semiconductor layer to have an area smaller than that of the multiplication layer, and forming an insulating layer on the multiplication layer around the n-type semiconductor layer thereafter.

4. The method of manufacturing an avalanche photodiode according to claim 2, further comprising a step of forming a p-type region on a side of the light absorption layer, which faces the p-type semiconductor layer.

5. The method of manufacturing an avalanche photodiode according to claim 2, wherein the second step includes:

a step of forming a metal layer on the transfer substrate; and a step of transferring the n-type semiconductor layer, the multiplication layer, the electric field control layer, and the light absorption layer formed on the growth substrate to the transfer substrate on which the metal layer is formed.

6. The method of manufacturing an avalanche photodiode according to claim 1, wherein the first step includes:

a step of forming the n-type semiconductor layer, the multiplication layer, the electric field control layer, and the light absorption layer in this order on the growth substrate; and a step of forming the p-type semiconductor layer on the transfer substrate, and the second step includes:

a step of transferring the n-type semiconductor layer, the multiplication layer, the electric field control layer, and the light absorption layer formed on the growth substrate to the transfer substrate by adhering the p-type semiconductor layer on the light absorption layer; and a step of removing the growth substrate after the p-type semiconductor layer is adhered on the light absorption layer.

7. The method of manufacturing an avalanche photodiode according to claim 6, further comprising a fourth step of processing the n-type semiconductor layer to have an area smaller than that of the multiplication layer, and forming an insulating layer on the multiplication layer around the n-type semiconductor layer thereafter.

8. The method of manufacturing an avalanche photodiode according to claim 6, further comprising a step of forming a p-type region on a side of the light absorption layer, which faces the p-type semiconductor layer.

9. The method of manufacturing an avalanche photodiode according to claim 6, wherein the second step includes:

a step of forming a metal layer on the transfer substrate; and a step of transferring the n-type semiconductor layer, the multiplication layer, the electric field control layer, and the light absorption layer formed on the growth substrate to the transfer substrate on which the metal layer is formed.

10. The method of manufacturing an avalanche photodiode according to claim 1, further comprising a fourth step of processing the n-type semiconductor layer to have an area smaller than that of the multiplication layer, and forming an insulating layer on the multiplication layer around the n-type semiconductor layer thereafter.

11. The method of manufacturing an avalanche photodiode according to claim 10, further comprising a step of forming a p-type region on a side of the light absorption layer, which faces the p-type semiconductor layer.

12. The method of manufacturing an avalanche photodiode according to claim 10, wherein the second step includes:

a step of forming a metal layer on the transfer substrate; and a step of transferring the n-type semiconductor layer, the multiplication layer, the electric field control layer, and the light absorption layer formed on the growth substrate to the transfer substrate on which the metal layer is formed.

13. The method of manufacturing an avalanche photodiode according to claim 1, further comprising a step of forming a p-type region on a side of the light absorption layer, which faces the p-type semiconductor layer.

14. The method of manufacturing an avalanche photodiode according to claim 13, wherein the second step includes:

a step of forming a metal layer on the transfer substrate; and a step of transferring the n-type semiconductor layer, the multiplication layer, the electric field control layer, and the light absorption layer formed on the growth substrate to the transfer substrate on which the metal layer is formed.

15. The method of manufacturing an avalanche photodiode according to claim 1, wherein the second step includes:

a step of forming a metal layer on the transfer substrate; and a step of transferring the n-type semiconductor layer, the multiplication layer, the electric field control layer, and the light absorption layer formed on the growth substrate to the transfer substrate on which the metal layer is formed.

16. An avalanche photodiode comprising:

a p-type semiconductor layer formed on a substrate and made of a p-type semiconductor;

a light absorption layer formed on the p-type semiconductor layer and made of germanium;

an electric field control layer formed on the light absorption layer and made of a p-type semiconductor;

a multiplication layer formed on the electric field control layer and made of silicon;

an n-type semiconductor layer formed on the multiplication layer, made of n-type silicon, and having an area smaller than that of the multiplication layer; and an insulating layer formed only on a region around the n-type semiconductor layer out of a surface, contacting with the n-type semiconductor layer, of the multiplication layer.

17. An Avalanche photodiode comprising:

a p-type semiconductor layer formed on a substrate and made of a p-type semiconductor;

a light absorption layer formed on the p-type semiconductor layer and made of germanium;

an electric field control layer formed on the light absorption layer and made of a p-type semiconductor;

a multiplication layer formed on the electric field control layer and made of silicon, and an n-type semiconductor layer formed on the multiplication layer, made of n-type silicon, having an area smaller than that of the multiplication layer, further comprising a metal layer formed between the substrate and the p-type semiconductor layer.

* * * * *